(12) United States Patent
Johnson

(10) Patent No.: US 7,004,644 B1
(45) Date of Patent: Feb. 28, 2006

(54) HERMETIC CHIP-SCALE PACKAGE FOR PHOTONIC DEVICES

(75) Inventor: Klein L. Johnson, St. Paul, MN (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 09/342,801

(22) Filed: Jun. 29, 1999

(51) Int. Cl.
G02B 6/36 (2006.01)
H01L 23/02 (2006.01)

(52) U.S. Cl. .......................... 385/89; 385/90; 385/94; 257/680

(58) Field of Classification Search ............ 385/88–94; 438/121–122, 106; 257/678, 680
See application file for complete search history.

(56) References Cited

U.S. PATENT DOCUMENTS

| | | | |
|---|---|---|---|
| 4,092,061 A | 5/1978 | Stigliani, Jr. | |
| 4,873,566 A | 10/1989 | Hokanson et al. | |
| 4,897,711 A | 1/1990 | Blonder et al. | |
| 4,952,016 A | 8/1990 | Adams et al. | |
| 4,962,991 A | 10/1990 | Carvalho | |
| 5,052,009 A | 9/1991 | Tsubol et al. | |
| 5,089,861 A | 2/1992 | Tanaka et al. | |
| 5,125,054 A | 6/1992 | Ackley et al. | |
| 5,230,458 A * | 7/1993 | Asanasavest | 228/102 |
| 5,249,245 A | 9/1993 | Lebby et al. | |
| 5,253,311 A | 10/1993 | Killen et al. | |
| 5,359,686 A | 10/1994 | Galloway et al. | |
| 5,361,317 A | 11/1994 | Hartman et al. | |
| 5,371,820 A | 12/1994 | Welbourn et al. | |
| 5,375,184 A | 12/1994 | Sullivan | |
| 5,414,786 A | 5/1995 | Ohta et al. | |
| 5,420,954 A | 5/1995 | Swirhun et al. | |
| 5,499,312 A | 3/1996 | Hahn et al. | |
| 5,539,848 A | 7/1996 | Galloway | |
| 5,574,814 A * | 11/1996 | Noddings et al. | 385/90 |
| 5,587,336 A * | 12/1996 | Wang et al. | 438/17 |
| 5,596,662 A | 1/1997 | Boscher | |
| 5,613,024 A | 3/1997 | Shahid | |
| 5,625,734 A | 4/1997 | Thomas et al. | |
| 5,662,263 A * | 9/1997 | Urushima | 228/102 |

(Continued)

FOREIGN PATENT DOCUMENTS

DE 19527026 7/1995

(Continued)

OTHER PUBLICATIONS

Flexible interposing Carrier Scheme for Optical Waveguide, p. 512, Research Disclosure 30344.

(Continued)

Primary Examiner—Frank G. Font
Assistant Examiner—Michael P. Mooney
(74) Attorney, Agent, or Firm—Workman Nydegger

(57) ABSTRACT

A package having one or more integrated circuit photonic devices in a hermetically sealed enclosure. The photonic devices may be sources or detectors of light. The sealed enclosure consists of a transparent window attached to a first level housing. The transparent window contains patterned electrically conductive traces for purposes of routing electrical signals to and from semiconductor chip, which is bonded to patterned window. A second level housing is attached to the first level housing, and aligned via mechanical features incorporated with the transparent window. The second level housing provides a receptacle for a plug having light waveguides or optical fibers that are aligned with the photonic devices when inserted through the plug receptacle. One or more pins are inserted through the plug and the second level housing to secure the plug in the receptacle to the hermetically sealed photonic devices, such as VCSEL's on an integrated circuit semiconductor.

41 Claims, 4 Drawing Sheets

U.S. PATENT DOCUMENTS

| | | | |
|---|---|---|---|
| 5,665,639 A * | 9/1997 | Seppala et al. | 438/15 |
| 5,666,449 A | 9/1997 | Sawae et al. | |
| 5,706,378 A | 1/1998 | Suzuki et al. | |
| 5,717,800 A | 2/1998 | Funabashi | |
| 5,748,658 A | 5/1998 | Nakanishi et al. | |
| 5,763,888 A | 6/1998 | Glasheen et al. | |
| 5,774,614 A | 6/1998 | Gilliland et al. | |
| 5,790,731 A | 8/1998 | Deveau | |
| 5,812,717 A | 9/1998 | Gilliland | |
| 5,814,870 A | 9/1998 | Spaeth | |
| 5,835,514 A | 11/1998 | Yuen et al. | |
| 5,898,722 A * | 4/1999 | Ramdani et al. | 372/50 |
| 5,940,564 A * | 8/1999 | Jewell | 385/93 |
| 5,940,964 A * | 8/1999 | Mugiya | 29/840 |
| 6,025,213 A * | 2/2000 | Nemoto et al. | 438/122 |
| 6,064,423 A * | 5/2000 | Geng | 348/36 |
| 6,071,016 A * | 6/2000 | Ichino et al. | 385/92 |
| 6,081,638 A | 6/2000 | Zhou | |
| 6,097,087 A * | 8/2000 | Farnworth et al. | 257/698 |
| 6,097,748 A * | 8/2000 | Huang et al. | 372/50 |
| 6,097,871 A * | 8/2000 | De Dobbelaere et al. | 385/129 |
| 6,100,104 A * | 8/2000 | Haerle | 438/33 |
| 6,100,804 A * | 8/2000 | Brady et al. | 340/572.7 |
| 6,188,711 B1 * | 2/2001 | Corzine et al. | 372/96 |
| 6,194,789 B1 | 2/2001 | Zhou | |
| 6,205,274 B1 | 3/2001 | Zhou | |
| 6,222,206 B1 * | 4/2001 | Chirovsky et al. | 257/98 |
| 6,275,513 B1 | 8/2001 | Chnag-Hasnain et al. | |
| 6,303,219 B1 * | 10/2001 | Sawamura et al. | 428/343 |
| 6,521,989 B1 | 2/2003 | Zhou | |
| 6,588,949 B1 | 7/2003 | Zhou | |

FOREIGN PATENT DOCUMENTS

| | | |
|---|---|---|
| EP | 90308649.4 | 8/1990 |
| JP | 59007940 | 1/1984 |
| JP | 60-153184 | 8/1985 |
| JP | 63280574 | 11/1988 |
| JP | 05279967 | 11/1993 |
| JP | 07-134223 | 5/1995 |
| JP | 08101759 | 4/1996 |
| JP | 09041951 | 2/1997 |
| WO | WO 92/00538 | 1/1992 |

OTHER PUBLICATIONS

Optical Connection Circuit, Japanese Abstract publication #63-280206.

Article "Photochemically machined, glass ceramic, optical fiber interconnection components", Joel L. Plawsky, Gregory E. Williams, Paul A. Sachenik, Corning Glass Works, Corning, NY 14831, SPIE vol. 994 Optoelectronic Materials, Devices, Packaging and Interconnects (1988) pps. 101-106.

Article: "Passive Laser-Fiber Alignment by Index Method", M.S.Cohen, M.F.Cina, E.Bassous, M.M.Oprysko and J.L. Speidell. 1991 IEEE Photonics Technologty Letters, pps. 985-987.

Article: "New Materials and Design Components for Integrated Optics" Mir Akbar Ali, President, Glass & Ceramics Intl., Inc. 2017 Lomita Blvd., Lomita, CA 90717, Technology Report/Fiberoptics.

Article: "Polymeric Waveguides" by Charles T. Sullivan, Bruce L. Booth, Anis Husain, 1992 IEEE, Jan. 1992.

Shweky, et al., "A CSP Optoelectronic Package For Imaging And Light Detection Applications", Part of the IS&T/SPIE Conference on Sensors, Cameras , and Applications, pp. 63-68, 1999.

Mike Teska, "Fine Line PCB Assembly Leads to New Test Issues", Electronic Packaging & Production, pp. 54-56, 1998.

Alles, David S., "Trends in Laser Packaging," IEEE, 0569-5503/90/0000-0185, pp. 185-192.

Fukuoka, et al., "Hybrid Microcircuit Fiber Optics System Receiver Hermetically Sealed," The International Journal for Hybrid Microelectronics, vol. 6, No. 2, pp. 5-9, Dec. 1983.

Kosaka, et al., "Plastic-Based Receptacle-Type VCSEL-Array Modules with One and Two Dimensions Fabricated Using the Self-Alignment Mounting Technique," IEEE, Electronic Components and Technology Conference, pp. 382-390, 1997.

Norton, et al., "OTPOBUS™ I: A Production Parallel Fiber Optical Interconnect," IEEE, Electronic Components and Technology Conference, pp. 204-209, 1997.

Spector, Murray, "Design of a Solid State Laser Hybrid Package," International Journal for Hybrid Microelectronics, vol. 5, No. 2, pp. 172-174, Nov. 1982.

* cited by examiner

HERMETIC CHIP-SCALE PACKAGE FOR PHOTONIC DEVICES

BACKGROUND

The Government may have rights in this invention pursuant to Contract No. F30602-97-2-0120, awarded by the Department of the Air Force.

Optical coupling and electrical connections to photonic devices, particularly arrays of them on a single chip, are subject to environmental effects, electrical parasitics, and mechanical misalignment. There appears to be no adequate packaging approaches available to effectively eliminate these problems and at the same time provide ruggedized, compact, high-performance and reliable systems.

SUMMARY OF THE INVENTION

The invention is a hermetic packaging of optical emitters and/or detectors via bump bonding on an electrically patterned transparent window. It is to simultaneously provide sealed containment or hermeticity and optical coupling to VCSEL's or detectors, either in arrays or as single devices. These devices or device are made of a semiconductor such as gallium arsenide. Hermeticity is often required for environmentally sensitive devices. No such hermetic array package is known.

The semiconductor is bump bonded to a window patterned with electrically conductive traces, which is itself sealed at the periphery to a ceramic or similar package. Electrical connections to, say, multi-layer impedance controlled traces external to the sealed cavity are accomplished within the ceramic package. The window may be equipped with refractive or diffractive lenses to improve optical coupling into and out-of the package. The optical devices and corresponding lenses may be in the form of one or two-dimensional arrays. Fibers being optically connected to an array of devices may be in the form of a ribbon or cord having a multitude of fibers for conveying light to or from the devices. Mechanical features are included to provide passive or semi-active alignment to a second level package that encompasses the first level package containing the optical devices. The package may be used in conjunction with an optical back plane. This approach provides precision optical coupling alignment, mechanical ruggedness, compactness, optical and electrical isolation, very low parasitics, high speed performance, protection from moisture, humidity and other dehabilitating contaminants of the ambient environment, device reliability, and fabrication advantage.

DESCRIPTION OF THE EMBODIMENTS

Figure 1A:
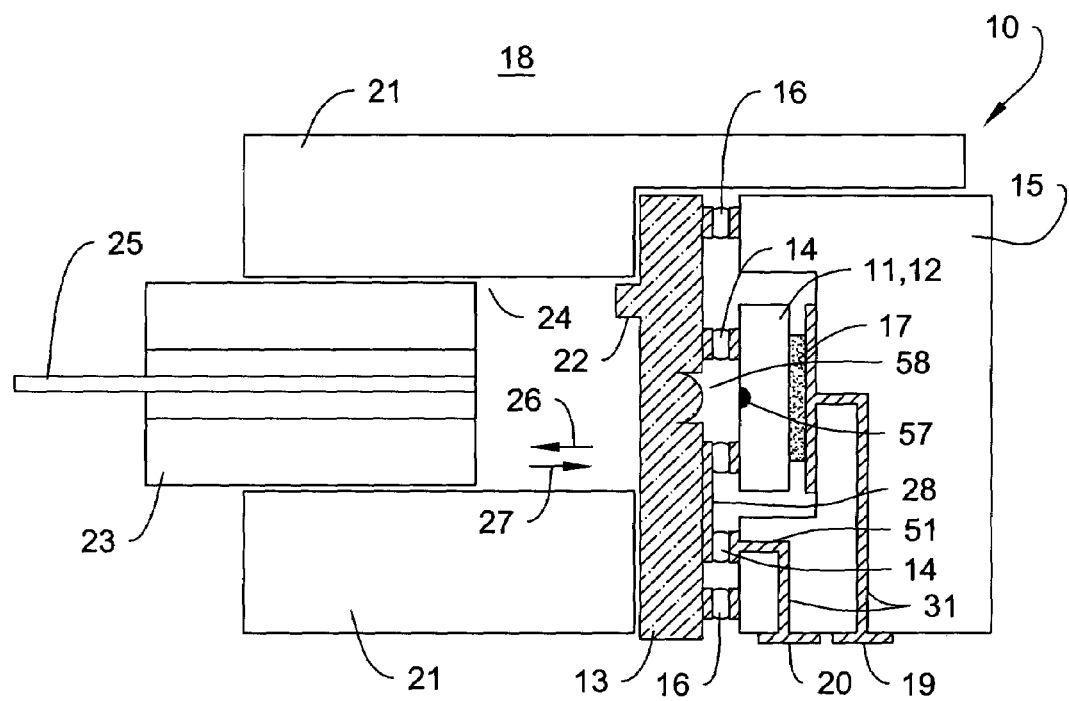
FIG. 1a shows a hermetic 1st-level package for optical devices and their optical and electrical couplings, both to board-level electrical pads and to optical fibers via the indicated 2nd-level package assembly.

FIG. 1a shows a hermetic chip scale package 10 for photonic devices. To attain hermeticity and efficient optical coupling to a linear or 2-dimensional array of VCSEL's 11 and/or detectors 12, the semiconductor die containing the VCSEL's or detectors is bump bonded to a partially metalized window 13 at electrically conductive bump 14. Window metallization 28 can be some combination Cr, Pt, Au, Ti, Cu, ITO, or Ni, either sputtered, evaporated, or plated. Window 13 is also sealed at the periphery to multi-layer ceramic package 15 with hermetic solder seal 16, while simultaneously completing chip-to-window electrical connection at conductive bump 14. Chip 11, 12 is attached to ceramic package 15 via electrical and/or thermal connection 17. Chip 11, 12 is hermetically sealed from an ambient environment 18 of device 10. Electrical connection 17 is connected to chip 11, 12 and to external pad 19 via conductive path 31. The pad at bump 14 is also connected to electrical path 31 via conductive trace 28 from chip 11, 12 to pad 51, and thereby to external electrical connection pad 20 via path 31. A refractive and/or diffractive optical element 58 may be etched into or deposited on a surface of the window to facilitate improved optical coupling efficiency. The package, so far described, is a first level package.

A second level package is housing 21 and fits on and around the first level package encompassing chip 11, 12 within a hermetic seal. Housing 21 is mechanically aligned with one or more keys 22 on window 13. Ferrule 23 is inserted within housing 21 and may be slid into a position where an edge 24 of the ferrule buts up against key or keys 22. Situated in ferrule 23 is a fiber or fibers 25, which convey light signals 26 from VCSEL's 11, and/or light signals 27 to detectors 12. Housing 21 may be secured to the first level housing with glue, adhesive or an epoxy. Once ferrule 23 is inserted all the way into housing 21, it may or may not be glued into place.

Figure 1B:
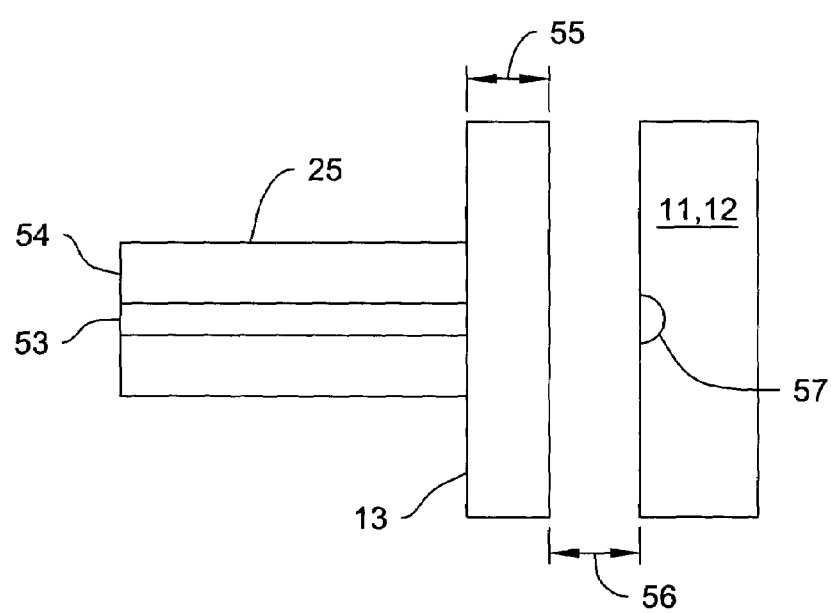
FIG. 1b provides a view of the optical coupling between optical fibers and a photonic device.

FIG. 1b shows a closer view of the optical coupling between fiber 25 and photonic device 11, 12. Light comes or goes through core 53 of fiber 25. Cladding 54 covers and protects glass core 53. Cladding has an index of refraction so as to contain the light within core 53. Fiber 53 butts up against window 13. Window 13 has a thickness 55 that ranges from roughly 25 to 250 microns. The index of refraction of the material of window 13 is about 1.52. That index may vary dependent on the particular design of package 10. Between window 13 and the emanating or sensing portion 57 of device 11, 12, there is a gap 56 of about 25 microns.

Figure 2A:
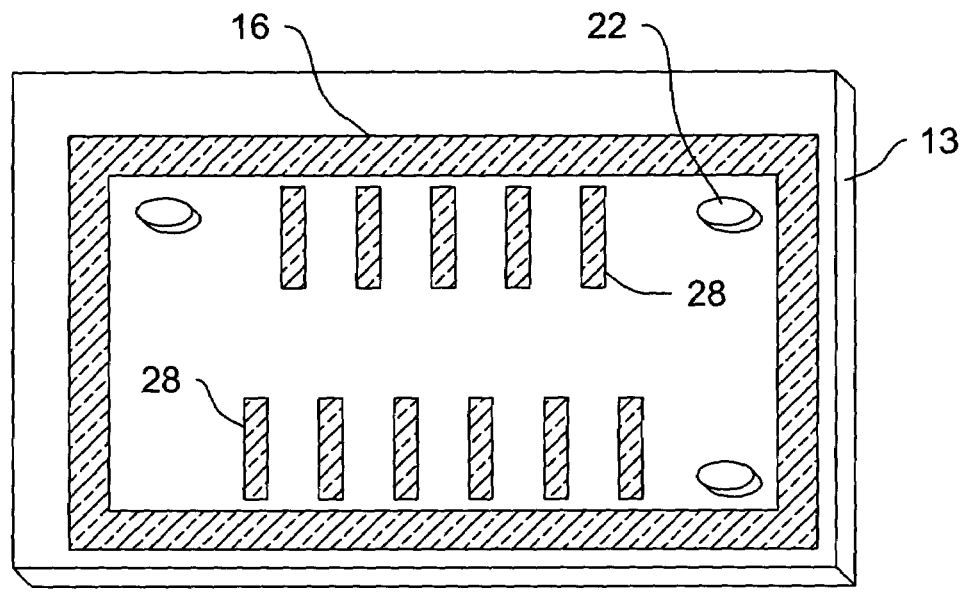
FIG. 2a shows a window having metal traces and mechanical registration features formed on it.

FIG. 2a shows window 13 onto which first level housing 15 is adhered via solder sealed 16. Light signal source 11 or detector 12 is bump bonded to transparent window 13 via electrically conductive or metal traces 28 on the surface of window 13 and metal terminals 29 on chip 11, 12 with solder bumps 14. Metalization strips 28 may have lateral dimensions of 20 to 50 microns, and thicknesses of less than 5 microns. Chip 11, 12 is typically between 3 and 8 millimeters. Window 13 may be composed of a material such as quartz or sapphire. Solder ring 16 may be composed of tin in combination with lead, gold or sliver. Solder bumps 14 may be composed of tin in combination with lead, gold or silver.

Figure 2B:
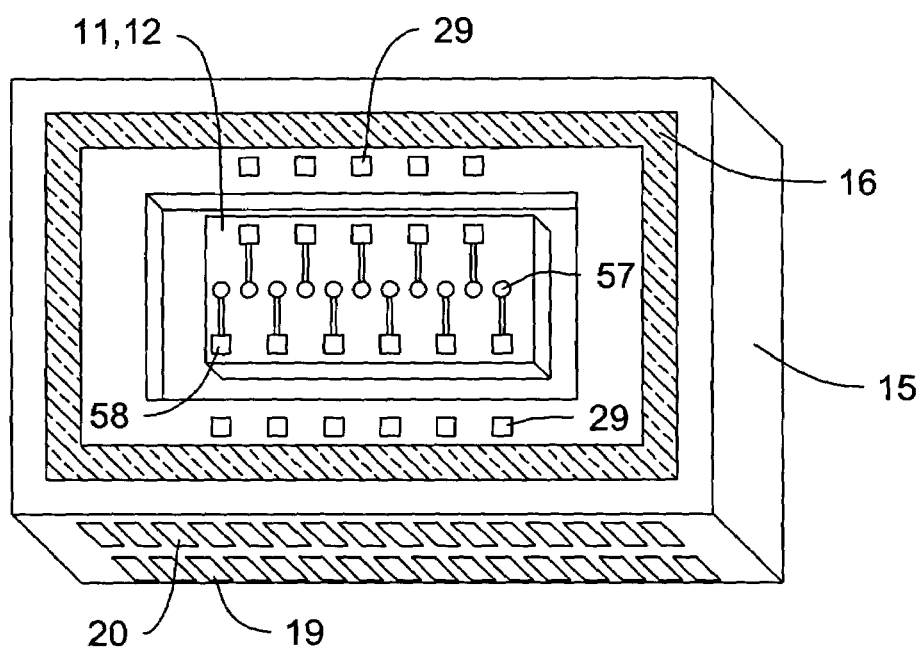
FIG. 2b reveals a housing having photonic devices, the electrical interconnects of which match up with the corresponding interconnects on the window.

FIG. 2b illustrates housing 15 having optical devices 11, 12 with electrical connecting spots 58 that match up with conductive strips 28 so as to electrically connect sensitive areas 57 of devices 11, 12 with connecting spots 29. External connections 20 are connected in housing 15 to connecting spots 29.

Figure 3A:
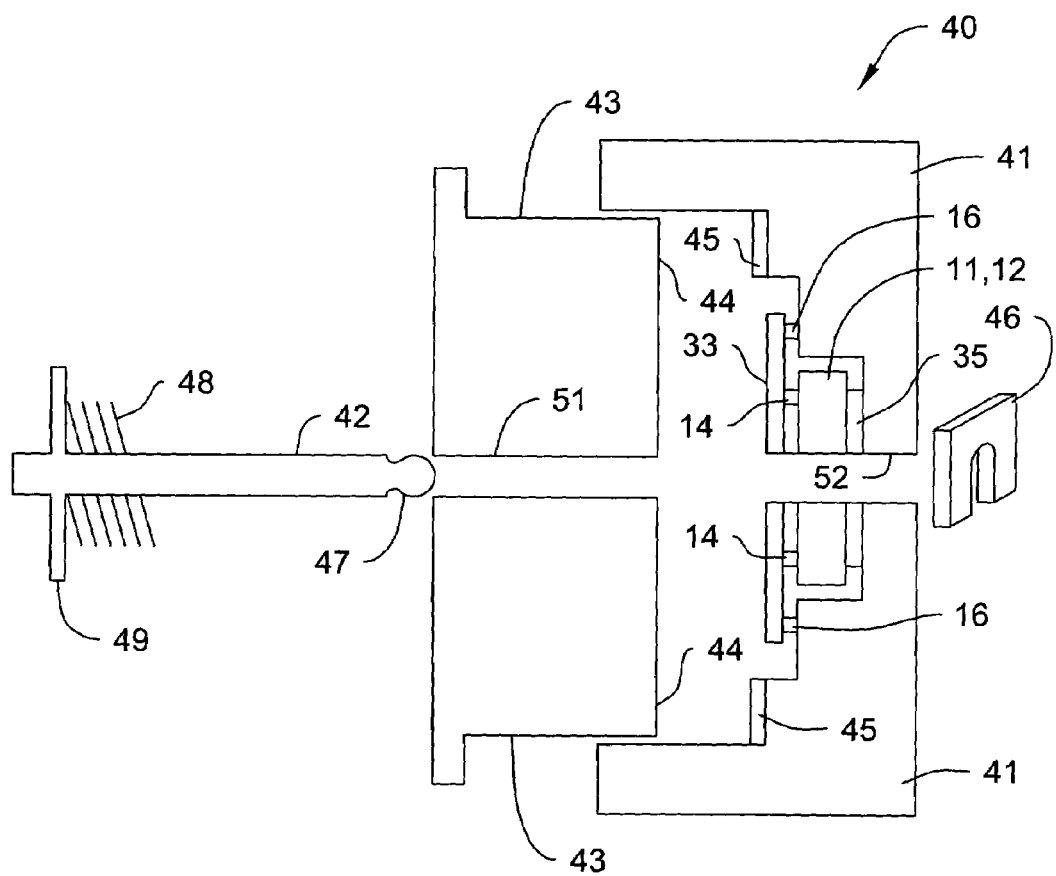
FIGS. 3a and 3b illustrate a housing having a pin arrangement for connecting and securing a ferrule or plug having the optical light wave guides or fibers that are brought next to the window.
Figure 3B:
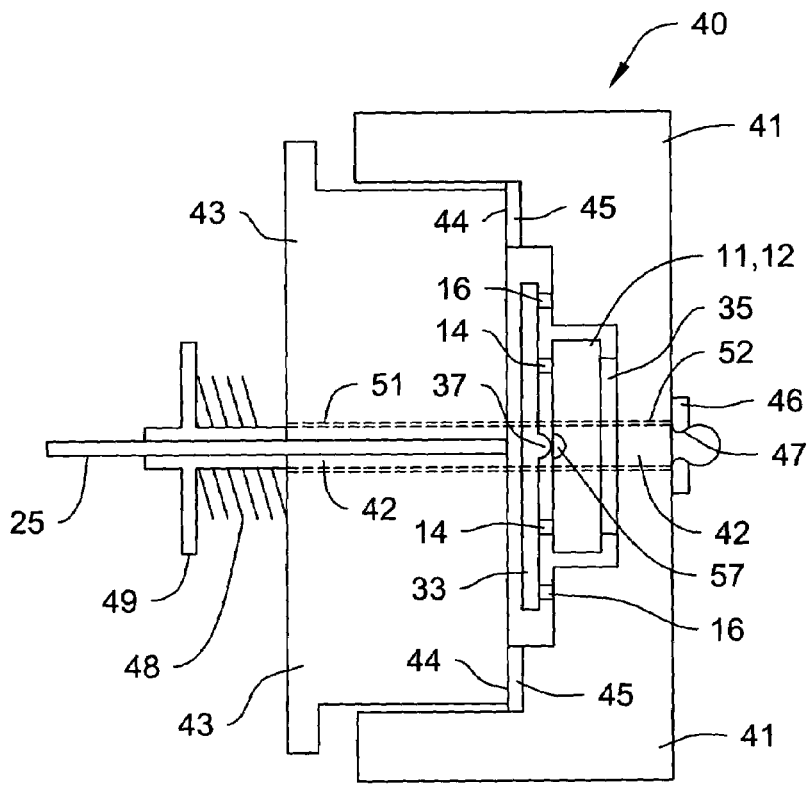

FIG. 3a shows an embodiment 40, which utilizes a pin 42 to hold plug or ferrule 43 to housing 41. FIG. 3a shows a cut-away section along pin 42. FIG. 3b, on the other hand, shows a cut-away section along fiber 25 and emanation or receptor area 57. Ferrule 43 has an edge 44 which is butted up against bumper 45, which may be an elastomeric seal, as shown in FIG. 3b. Pin 42 is inserted through an alignment hole 51 in ferrule 43 and alignment hole 52 in housing 41 and is secured in place with a retaining clip 46 inserted in notch 47 at the end of pin 42. Ferrule 43 is held firmly in place with the tension of a loading spring 48 between ferrule 43 and clip or shoulder 49 at the end of pin 42, which is opposite of the end having notch 47. Pin 42 and holes 51 and 52 provide a less than the plus or minus five micron alignment between fiber 25 and VCSEL 11 or detector 12 emanation or receptor area 57, respectively, as shown in FIG. 3b. Since ferrule 43 is not glued to housing 41, it may be removed whenever desired by removing clip 46 from notch 47. Chip 11, 12 according to embodiment 40 is hermetically sealed. However, one may choose to have chip 11, 12 not hermetically sealed by replacing the multi-layer ceramic packaged with an FR4 or equivalent plastic package in cost-reduced embodiment 40.

Figure 4A:
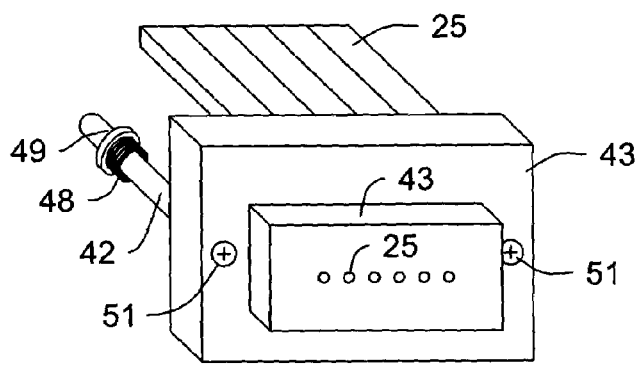
FIGS. 4a and 4b shows a perspective view of a plug and housing having the pin arrangement.
Figure 4B:
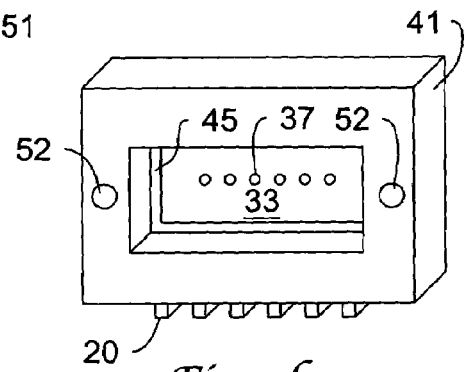

An arrangement, as shown in FIGS. 4a and 4b, has one or more pins 42 holding a ferrule 43 with a fiber array 25 to housing 41. Pins 42 and respective holes 51 and 52 are placed on each side of fiber array 25 for secure, robust and precision alignment of fiber array 25 with lens 37 and sensitive or emanating area 57 of chip 11, 12.

In another embodiment, plug or ferrule 43 may be part of a backplane, and housing 41 may be attached to an opto-component circuit board, which is plugged into the backplane via plug 43 and housing 41.

Other embodiments and variants of the present invention, not disclosed here, are covered by the claims and only limited in scope by the claims, which includes all equivalents thereof.

What is claimed is:

1. A chip-scale package for photonic devices, comprises:
a window having one or more conductive traces on a first side of said window;
a chip fixed relative to the first side of said window, said chip having at least one electrical terminal;
a first housing having a body with an outer surface and an inner surface and extending around said chip and fixed relative to said window, said first housing having one or more electrical terminals along its outer surface that are electrically connected, through the body via an embedded trace in the housing, to at least one electrical terminal along the inner surface of the housing; and
at least one terminal of said chip being bump bonded to a first conductive trace on said window, and at least one said electrical terminal along the inner surface of the housing being bump bonded to said first conductive trace on said window.

2. The package of claim 1, wherein said chip is hermetically sealed by said window and said first housing.

3. The package of claim 2, wherein said first housing is sealed to said window at the periphery of said window by a sealing-type material.

4. The package of claim 1, wherein said chip comprises a photonic device.

5. The package of claim 4, further comprising a second housing situated adjacent to a second side of said window.

6. The package of claim 5, further comprising a ferrule having at least one optical fiber, which is placed adjacent said second side of said window.

7. The package of claim 6, further comprising a lens formed on or in said window.

8. The package of claim 7, wherein said ferrule is accepted by an opening in said second housing.

9. The package of claim 8, wherein an end of said optical fiber is proximate to said window so that light from the fiber can go through the optical fiber and said window to the photonic device, and/or so that light from the photonic device can go through said window and the least one optical fiber.

10. A chip-scale package for electronic devices, comprising:
a transparent window having at least one conductive trace patterned on a surface of said window;
a semiconductor chip fixed relative to said window having at least one terminal connected to the at least one conductive trace;
a first housing surrounding said chip and affixed to said window; and
a conductive path embedded in said housing from the at least one conductive trace to an at least one pad on an external surface of said housing.

11. The package of claim 10, wherein said chip comprises a photonic device.

12. The package of claim 11, wherein said window has at least one feature on the surface of said window for alignment.

13. The package of claim 12, further comprising a second housing attached to said first housing.

14. The package of claim 13, wherein said second housing is mechanically registered to said first housing by the at least one feature on the surface of said window.

15. The package of claim 14, further comprising a ferrule having at least one optical waveguide.

16. The package of claim 15, wherein the at least one optical waveguide is proximate to said window so that light from the waveguide can pass through said window to that at least one photonic device, and/or so that light from the photonic device can go through said window and to the at least one optical waveguide.

17. The package of claim 16, wherein said window has at least one lens situated between the at least one photonic device and said at least one optical waveguide.

18. The package of claim 17, wherein the at least one optical waveguide is an optical fiber.

19. The package of claim 16, further comprising at least one pin securing said ferrule to said first housing.

20. The package of claim 11, wherein the at least one photonic device is a VCSEL.

21. The package of claim 10, wherein said first housing comprises ceramic.

22. The package of claim 10, wherein said window comprises quartz.

23. The package of claim 1, wherein that at least one terminal of said chip is bump bonded to the same conductive trace as the at least one terminal of said first housing.

24. The package of claim 1, wherein the at least one terminal of said first housing is electrically connected to a terminal outside of said first housing.

25. The package of claim 24, wherein said first housing is a multi-layer housing, and the at least one terminal of said first housing is electrically connected to a terminal outside of said first housing via a trace in the multi-layer housing.

26. The package of claim 25, wherein said chip includes a back side facing away from said window, wherein the back side of said chip is electrically connected to a terminal outside of said first housing via another trace in the multi-layer housing.

27. A chip-scale package for photonic devices, comprising:
a window;
a chip fixed relative to a first side of said window;
a first housing having a body with an outer surface and an inner surface, the inner surface extending around said chip and fixed relative to said window to form a chip cavity;
said first housing having at least one electrical terminal along its outer surface, which is electrically connected by an embedded electrical path through the body of the first housing to at least one electrical terminal along the inner surface of the first housing;
said window includes one or more conductive traces;
said chip includes one or more electrical terminals; and
at least one terminal of said chip is bump bonded to a conductive trace on said window, and at least one terminal along the inner surface of the first housing is bump bonded to a conductive trace on said window.

28. The package of claim 27, wherein the at least one terminal of said chip is bump bonded to the same conductive trace as the at least one terminal of said first housing.

29. The package of claim 27, wherein said first housing is a multi-layer housing.

30. A chip-scale for photonic devices, comprising:
a first housing having a body, an electrically conductive internal pad, an electrical path connected to said internal pad and embedded in said body, and an electrically conductive external pad connected to said electrical path;
a chip attached relative to said first housing, the chip having an electrically conductive pad that faces the window; and
a window attached relative to said first housing, wherein the internal pad of the housing faces said window;
at least one conductive trace formed on said window; and
wherein the at least one conductive trace is electrically connected to the pad of said chip and to the internal pad of said first housing.

31. The package of claim 30, wherein said first housing and said window form a hermetically sealed volume containing said chip.

32. The package of claim 31, wherein the first housing further includes an external pad situated externally relative to the sealed volume which is electrically connected to the internal pad of the first housing.

33. The package of claim 32, further comprising a second housing attached to said first housing.

34. The package of claim 33, wherein said chip has at least one photonic device.

35. A hermetic chip-scale package comprising:
a first housing;
an integrated circuit mounted within said first housing, the integrated circuit having at least one terminal;
a window secured relative to said first housing; and
wherein:
said integrated circuit has at least one photonic device; and
said first housing and said window form a hermetically sealed enclosure around said integrated circuit, said housing having a body with at least one conductor extending on an embedded path from an inner surface of the housing at the hermetically sealed enclosure to an outer surface of the housing, the at least one conductor having a low resistance path to a terminal of the integrated circuit.

36. The package of claim 35, wherein said window comprises at least one conductive trace connected to said terminal of said integrated circuit.

37. The package of claim 36, wherein the conductor of said housing is connected to the at least one conductive trace, for providing a connection from the at least one conductive trace external to the hermetically sealed enclosure.

38. The package of claim 37, further comprising a second housing situated adjacent to said window, wherein said second housing has at least one alignment feature.

39. A chip-scale package for photonic device, comprising:
a window;
a chip fixed relative to a first side of said window;
a housing having a body with an outer surface and an inner surface, the inner surface extending around said chip and fixed relative to said window to form a chip cavity; and
said housing being monolithic and having at least one electrical terminal along its outer surface, which is electrically connected through the body via an embedded trace in the housing to at least one electrical terminal along the inner surface of the housing.

40. The package of claim 39 wherein the window and the housing form a hermetically sealed chip cavity.

41. A chip-scale package for photonic devices, comprising:
a window;
a chip fixed relative to a first side of said window;
a housing having a body with an outer surface and an inner surface, the inner surface extending around at least part of said chip and fixed relative to said window to form a hermetically sealed chip cavity;
said housing having at least one electrical terminal along its outer surface, which is electrically connected though an embedded path in the body of the housing to at least one electrical terminal along the inner surface of the housing.

* * * * *

UNITED STATES PATENT AND TRADEMARK OFFICE
CERTIFICATE OF CORRECTION

PATENT NO. : 7,004,644 B1 Page 1 of 1
APPLICATION NO. : 09/342801
DATED : February 28, 2006
INVENTOR(S) : Klein L. Johnson It is certified that error appears in the above-identified patent and that said Letters Patent is hereby corrected as shown below:

Column 2
Line 1, change "shows" to --show--
Line 45, after "Fiber", change "53" to --25--

Column 4
Line 43, after "window", change "to" to --so--
Line 60, change "that" to --the--

Column 6
Line 28, change "device" to --devices--

Signed and Sealed this

Twenty-third Day of September, 2008

JON W. DUDAS
*Director of the United States Patent and Trademark Office*